(12) United States Patent
Ma et al.

(10) Patent No.: US 11,092,849 B2
(45) Date of Patent: Aug. 17, 2021

(54) LED BACKLIGHT DEVICE AND DISPLAY DEVICE

(71) Applicant: WUHAN CHINA STAR OPTOELECTRONICS TECHNOLOGY CO., LTD., Hubei (CN)

(72) Inventors: Changwen Ma, Hubei (CN); Guowei Zha, Hubei (CN); Zhou Zhang, Hubei (CN)

(73) Assignee: WUHAN CHINA STAR OPTOELECTRONICS TECHNLOGY CO., LTD., Hubei (CN)

( * ) Notice: Subject to any disclaimer, the term of this patent is extended or adjusted under 35 U.S.C. 154(b) by 489 days.

(21) Appl. No.: 16/309,743

(22) PCT Filed: Sep. 11, 2018

(86) PCT No.: PCT/CN2018/104985
§ 371 (c)(1),
(2) Date: Dec. 13, 2018

(87) PCT Pub. No.: WO2020/019421
PCT Pub. Date: Jan. 30, 2020

(65) Prior Publication Data
US 2021/0223630 A1    Jul. 22, 2021

(30) Foreign Application Priority Data
Jul. 26, 2018   (CN) .......................... 201810831167.0

(51) Int. Cl.
*G02F 1/00*    (2006.01)
*G02F 1/1335*    (2006.01)
*G02F 1/13357*    (2006.01)

(52) U.S. Cl.
CPC .. *G02F 1/133612* (2021.01); *G02F 1/133603* (2013.01)

(58) Field of Classification Search
CPC ....... H01L 33/50; H01L 33/36; H01L 23/585; H01L 25/0655; G02F 1/133612; G02F 1/03
See application file for complete search history.

(56) References Cited

U.S. PATENT DOCUMENTS 10,969,628 B1 * 4/2021 Zweigle ............ G02F 1/133608
2006/0081833 A1 * 4/2006 Peng .................... H01L 25/0753
257/13
(Continued)

FOREIGN PATENT DOCUMENTS

CN     101202321 A    6/2008
CN     107884987 A *  4/2018    ............. H01L 33/50
(Continued)

*Primary Examiner* — Gerald J Sufleta, II

(57) ABSTRACT

The present invention discloses a light emitting diode (LED) backlight device and LED display device, including a plurality of backlight partitions; a reflective material layer covering a surface of the backlight substrate; a plurality of metal traces disposed within the backlight partitions and disposed between the backlight substrate and the reflective material layer; a plurality of pad openings penetrating from a surface of the reflective material layer to a surface of the metal traces. An orthographic projection of the pad openings projected toward the backlight substrate is completely within an area of the metal traces; and a plurality of solder paste application regions located in the pad openings. The LED display device assembled by the LED backlight device according to the present invention improves the yield of solder paste printing and die bonding, improves the light reflection, reduces the loss of light energy, and improves the light efficiency.

10 Claims, 4 Drawing Sheets

(56) References Cited

U.S. PATENT DOCUMENTS

| | | | |
|---|---|---|---|
| 2006/0091403 A1* | 5/2006 | Chang | H01L 33/642 |
| | | | 257/79 |
| 2008/0137331 A1 | 6/2008 | Kaneko et al. | |
| 2009/0001404 A1* | 1/2009 | Ohata | H01L 33/647 |
| | | | 257/99 |
| 2011/0012153 A1* | 1/2011 | Kim | H01L 33/486 |
| | | | 257/98 |
| 2011/0084624 A1* | 4/2011 | Dekker | H01L 27/3225 |
| | | | 315/250 |
| 2012/0061716 A1* | 3/2012 | Yu | H01L 33/486 |
| | | | 257/99 |
| 2012/0113328 A1* | 5/2012 | Takeshima | G02F 1/133603 |
| | | | 348/739 |
| 2013/0020600 A1 | 1/2013 | Yoo | |
| 2013/0094187 A1* | 4/2013 | Kamada | G02F 1/133608 |
| | | | 362/97.3 |
| 2016/0276293 A1* | 9/2016 | Hung | H01L 33/48 |
| 2018/0145224 A1* | 5/2018 | Kim | H01L 33/502 |
| 2018/0233493 A1* | 8/2018 | Kawai | H01L 33/36 |
| 2020/0313049 A1* | 10/2020 | Huang | H01L 33/60 |
| 2020/0357846 A1* | 11/2020 | Lee | H01L 27/156 |
| 2021/0132444 A1* | 5/2021 | Watanabe | G02F 1/133608 |

FOREIGN PATENT DOCUMENTS

| | | |
|---|---|---|
| CN | 107910322 A | 4/2018 |
| CN | 207181893 U | 4/2018 |

* cited by examiner

LED BACKLIGHT DEVICE AND DISPLAY DEVICE

FIELD OF INVENTION

The present invention relates to display devices, particularly to a field of mini LEDs and the like, and more particularly to a LED backlight device and a LED display device.

BACKGROUND OF INVENTION

With rise of wearable application devices such as smart glasses, smart watches and the like, display industry demand for flexible display devices is also increasing. Organic light emitting diode (OLEDs) display has characteristics such as being self-luminous without a backlight source, thin thickness, wide viewing angles, and fast response times, so that it has an inherent advantages for flexible display. Confronted with competition of flexible OLEDs, traditional liquid crystal display technology progressively uses flexible substrates toward the breakout directions such as flexibility and curved surface and the like. It can be seen that an age of flexible and curved display is coming.

Mini LED, also known as "sub-millimeter light-emitting diode", refers to an LED with a die size being about 100 microns. Using mini LED in a direct-lit backlight is one development direction. Because the number of LEDs used on a single sheet of backlight in a display device is huge, in order to achieve excellent display, there are hundreds to thousands of backlight partitions. Moreover, because the development of the full screen of the mobile phone, using the small-sized mini LEDs which arrange in a smaller pitch can achieve a smaller light mixing distance. The small direct-lit backlight sources have a higher possibility for light, thin and narrow. Similar to the traditional edge-lit backlight, a surface of light source of mini LED also needs to use a brightness enhancement film (BEF), a reflector sheet and the like to enhance the brightness of the front surface. The difference is that the edge-lit backlight attaches a reflector sheet on the entirely bottom surface of the light guide plate, which can greatly improve the light reflection efficiency of the system. However, the mini LED direct-lit backlight uses a huge number of LEDs in an array, although the LEDs themselves and the bonding pads of LEDs constitute a large area ratio of non-reflector, and the gaps between LEDs are usually covered with high reflectance white solder resist or other highly reflective materials, but the overall reflection efficiency is still lower than the entirely surface reflector of edge-lit backlight structure, so that affects the overall reflection efficiency.

As shown in FIG. 1, FIG. 1 is a circuit design schematic view of a single backlight partition of a conventional mini LED backlight substrate, strips represent metal traces, boxes which are disposed on the metal traces represent pad opening regions of the metal traces, and black regions which are within the boxes represent solder paste application regions. During manufacturing of the backlight substrate, different degrees of process deviations may cause by the expansion and contraction of the backlight substrate, the etching process of metal traces, and the openings of reflective material. A single factor of the process deviations can be up to 50 um, which may result in the sizes of pad opening being different. A blank gap may exist between the reflective material and the pads, and the reflective material may cover pads disposed on p/n junctions of the mini LED, which affects electrical properties. If the deviations are considered in advance, it would make that the blank gap existing between the reflective material and the pad becomes larger, results in the poor luminous efficiency of the mini LED display and an inevitable loss of light energy. Moreover, the size of mini LED is comparatively small, and it still has problems such as solder paste printing and die-bonding even if the deviation is considered in advance. The above-mentioned problems cannot be solved simply by improving etching precision in each process.

SUMMARY OF INVENTION

The technical problem to be solved by the present invention is to provide a light emitting diode (LED) backlight device and a LED display device, by improving the design of metal traces on the backlight substrate, can effectively optimize the manufacturing process, reduce process deviation, improve the yield of solder paste printing and die bonding, improve the light reflection, reduce the loss of light energy, and improve the light efficiency.

In order to solve the above-mentioned technical problems, the present invention provides a backlight substrate, including:

a backlight substrate having a plurality of backlight partitions;

a reflective material layer covering a surface of the backlight substrate;

a plurality of metal traces disposed within the backlight partitions and disposed between the backlight substrate and the reflective material layer;

a plurality of pad openings penetrating from a surface of the reflective material layer to a surface of the metal traces, wherein an orthographic projection of each of the pad openings projected on the backlight substrate is completely within an area of the metal traces; and a plurality of solder paste application regions separately located in the corresponding pad openings.

In a preferred embodiment of the invention, the metal traces includes:

at least one pair of a positive electrode line and a negative electrode line, wherein the positive electrode line and the negative electrode line of a same pair are adjacent and parallel to each other;

a positive electrode connecting line connected to the positive electrode line; and a negative electrode connecting line connected to the negative electrode line.

In a preferred embodiment of the invention, the pad openings have a plurality of pairs, and each of the pairs of the pad openings includes:

a plurality of positive electrode pad openings corresponding to the positive electrode line;

a plurality of negative electrode pad openings corresponding to the negative electrode line.

In a preferred embodiment of the invention, the LED backlight device further includes:

a plurality of LED chips, each of which has a p-junction and a n-junction; and a plurality of pads separately fixed to the p-junction and the n-junction of the LED chip;

wherein the pads fixed on the p-junction of the LED chip correspond to the positive electrode pad openings, and the pads fixed on the n-junction of the LED chip correspond to the negative electrode pad openings.

In a preferred embodiment of the invention, each of the pad openings has a width that is smaller than a width of the positive electrode line or smaller than a width of the negative electrode line.

In a preferred embodiment of the invention, a width of a gap between the positive electrode line and the negative electrode line adjacent to each other ranges from 40 μm to 60 μm.

In a preferred embodiment of the invention, the backlight substrate is a flexible circuit board or a printed circuit board.

In a preferred embodiment of the invention, a distribution structure of the backlight partitions is a matrix structure.

In a preferred embodiment of the invention, a distance between two of the backlight partitions adjacent to each other ranges from 40 μm to 70 μm.

The invention also discloses a light emitting diode (LED) display device including the LED backlight device.

The invention has the advantages: the LED backlight device of the present invention is assembled into a LED display device, by improving the design of metal traces on the backlight substrate, can effectively optimize the manufacturing process, reduce process deviation, improve the yield of solder paste printing and die bonding, improve the light reflection, reduce the loss of light energy, and improve the light efficiency.

DESCRIPTION OF DRAWINGS

The present invention is further explained below in combination with the drawings and embodiments.

DETAILED DESCRIPTION OF PREFERRED EMBODIMENTS

The following description of embodiments combined with the accompanying drawings is provided to illustrate the specific embodiments of the present invention. The directional terms mentioned in the present invention, such as "upper", "lower", "front", "back", "left", "right", "top", "bottom", etc., are only directions by referring to the accompanying drawings, and thus the used directional terms are used to describe and understand the present invention, but the present invention is not limited thereto.

Figure 4:
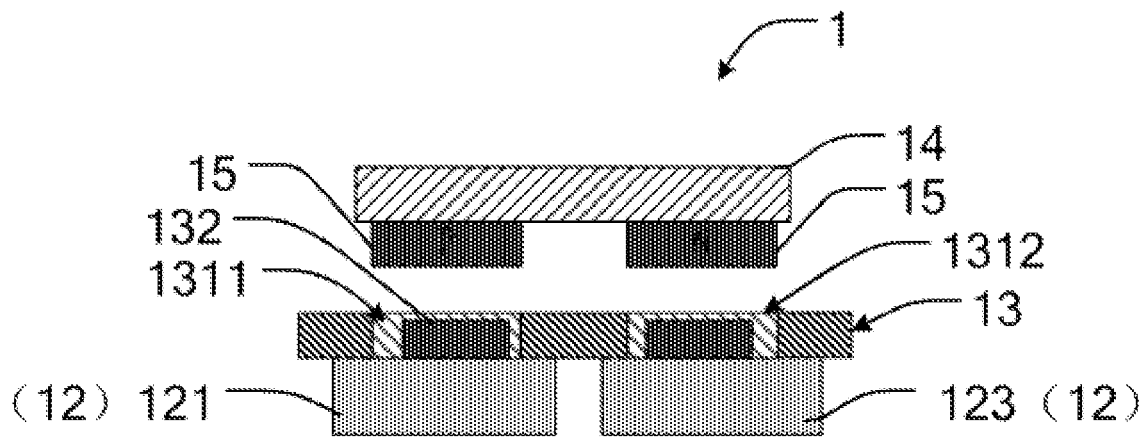
FIG. 4 is a cross-sectional view of a single LED chip according to the present invention corresponding to metal traces.

As shown in FIG. 4, in an embodiment according to present invention, a light emitting diode (LED) backlight device 1 includes a backlight substrate 11, metal traces 12, a reflective material layer 13, a plurality of LED chips 14 and pads 15.

Figure 1:
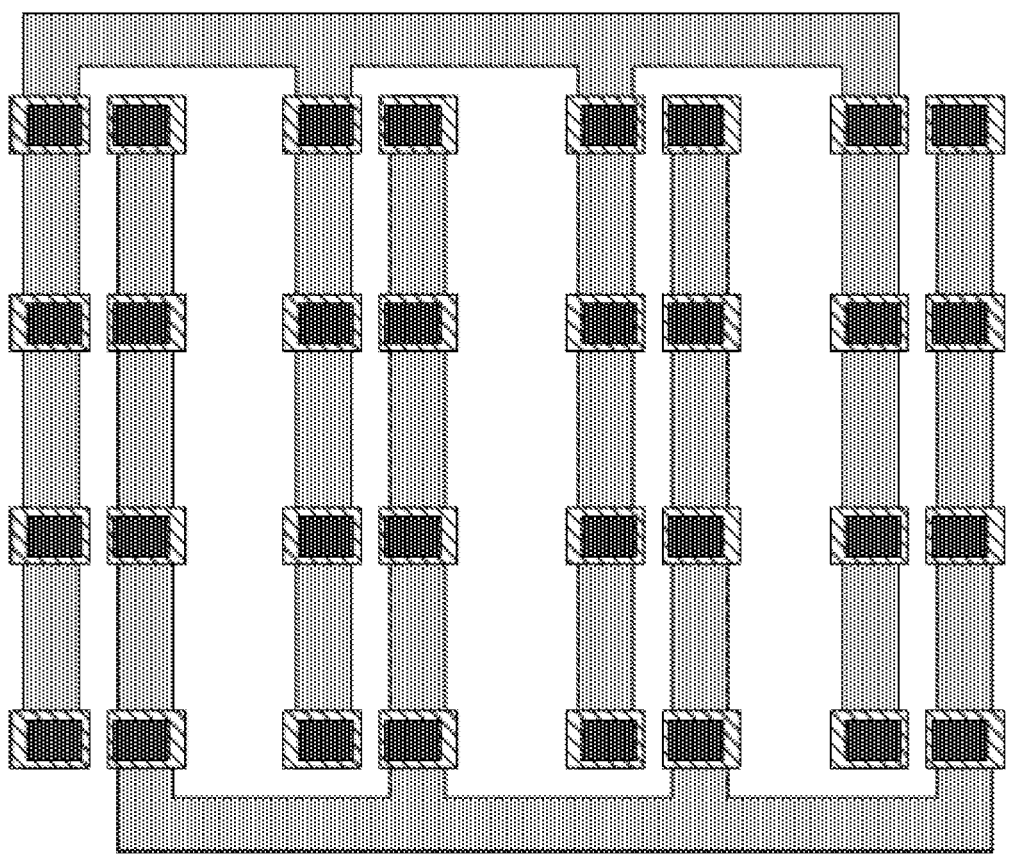
FIG. 1 is a circuit design schematic view of a single backlight partition of a conventional backlight substrate, which mainly shows a schematic distribution view of metal traces and pad openings.
Figure 2:
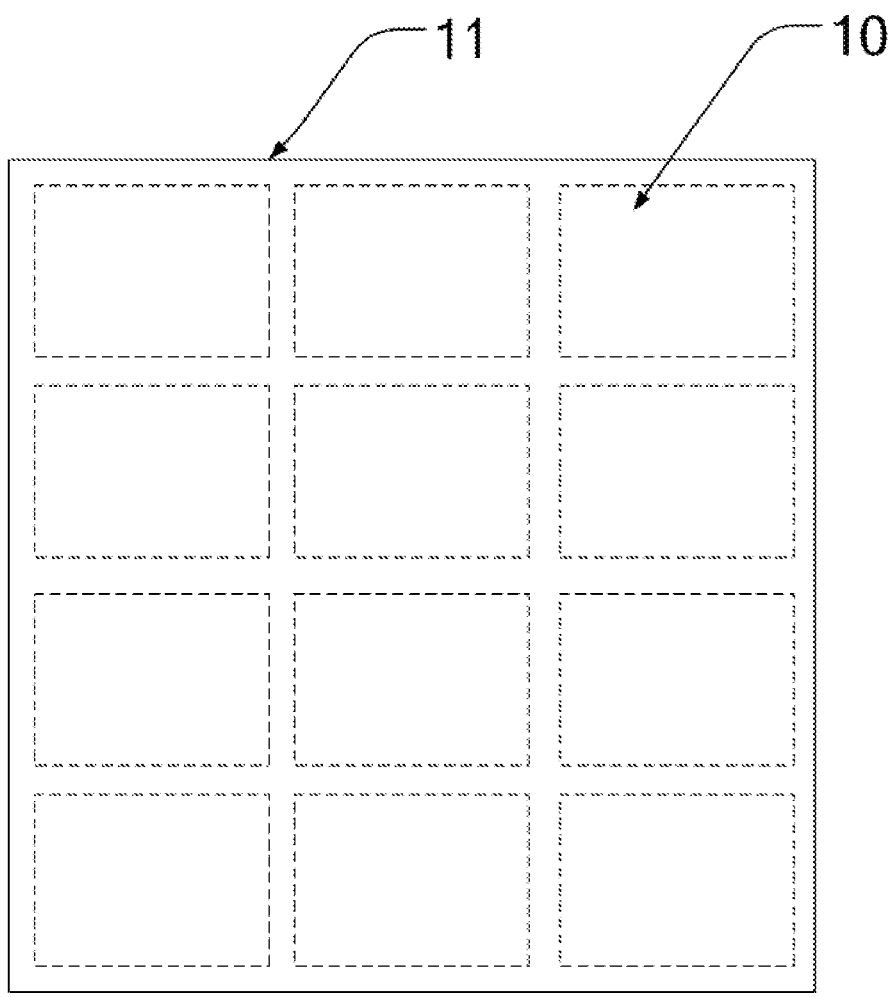
FIG. 2 is a schematic view of backlight partitions on a backlight substrate of a LED backlight device according to an embodiment of the present invention.

As shown in FIG. 2, the backlight substrate 11 is provided with a plurality of backlight partitions 10, and the size and number of the backlight partitions 10 are specifically designed according to the actual size parameter of the backlight substrate and the actual size parameter of the display screen. In this embodiment, a distribution structure of the backlight partitions 10 is a matrix structure, in order to ensure less loss of light energy, that is, to present less light to escape from a gap between the backlight partitions 10, this embodiment set that a distance between two of the backlight partitions 10 adjacent to each other ranges from 40 μm to 70 μm. In order to match the manufacturing process and reduce the difficulty of the manufacturing process, the distance can set as 55 μm or 60 μm. The backlight substrate 11 can be selected from a flexible circuit board or a printed circuit board depending on types of display.

As shown in FIG. 4, the metal traces 12 are disposed within each of the backlight partitions 10 (the reference number is shown in FIG. 2). The metal traces 12 are etched on a surface of the backlight substrate 11 by using an etching apparatus.

Figure 3:
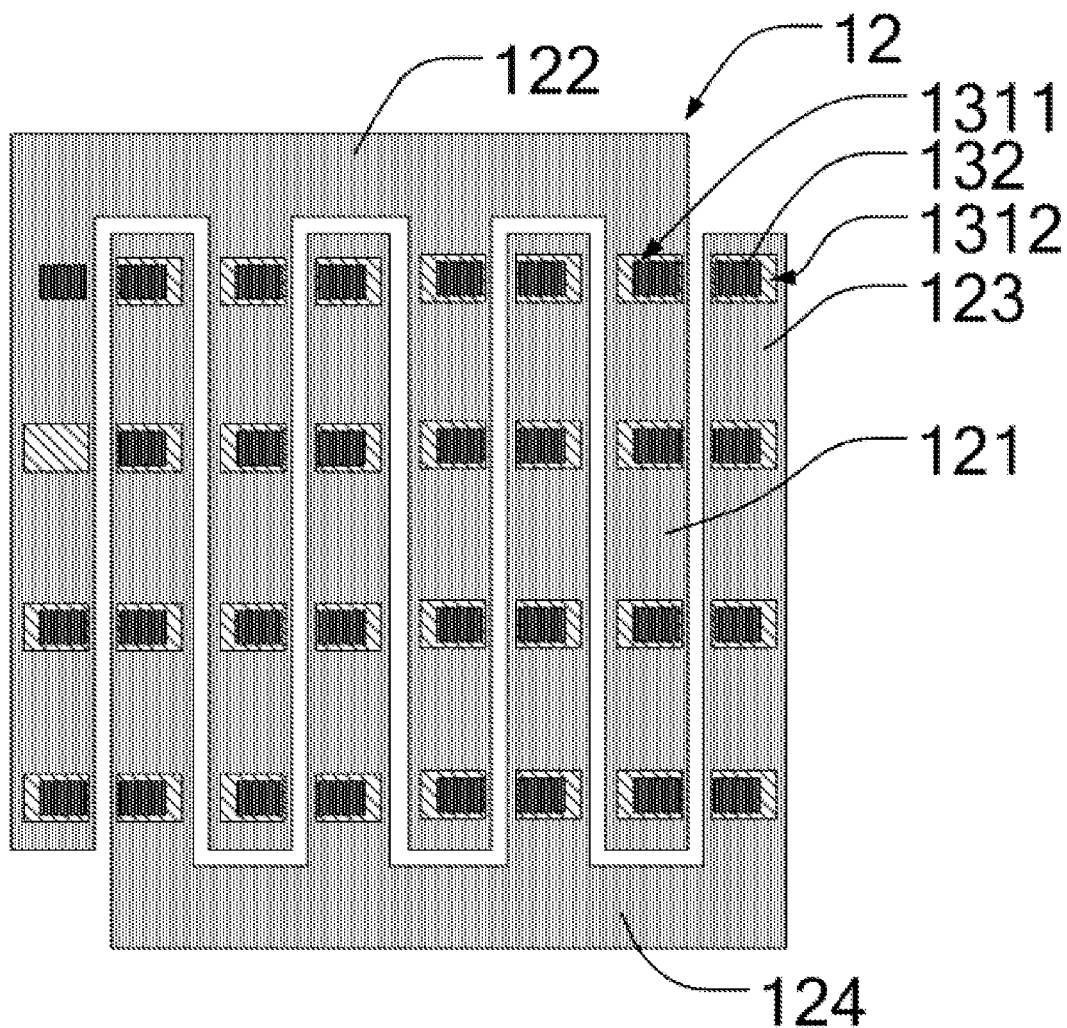
FIG. 3 is a circuit design schematic view of a single backlight partition according to an embodiment of the present invention, which mainly shows a schematic distribution view of metal traces and pad openings.

As shown in FIG. 3, the metal traces 12 are divided into a positive electrode trace and a negative electrode trace, and the positive electrode trace includes at least one positive electrode line 121 and a positive electrode connecting line 122, and the negative electrode trace includes at least one negative electrode line 123 and a negative electrode connecting line 124. In this embodiment, the metal traces 12 are provided with a plurality of positive electrode lines 121 and a plurality of negative electrode lines 123, each of positive electrode lines 121 is spaced apart from and parallel each other with one of the negative electrode lines 123, so the positive electrode lines 121 and the negative electrode line 123 adjacent to each other form a pair. Wherein, one end of each of the positive electrode lines 121 is connected to the positive electrode connecting line 122, and one end of each of the negative electrode lines 123 is connected to the negative electrode connecting line 124.

In order to enable the metal traces 12 to be maximally distributed on the substrate, and pad openings can always correspond to the corresponding circuit electrodes, a width of a gap between the positive electrode line 121 and the negative electrode line 123 adjacent to each other ranges from 40 μm to 60 μm, preferably 50 μm. Similarly, a width of a gap between the positive electrode line 121 and the negative electrode connecting line 124 ranges from 40 μm to 60 µm, preferably 50 µm. A width of a gap between the negative electrode line 123 and the positive electrode connecting line 122 ranges from 40 µm to 60 µm, preferably 50 µm.

Besides, the metal traces 12 in a same backlight partitions 10 are also required to be maximally distributed over the backlight substrate 11, and a same minimum circuit pitch is also required to be used in different backlight partitions 10 on the same backlight substrate 11. Because the light transmission of the metal traces is poor, this kind of layout can greatly reduce that the light of LED disposed on front surface of the backlight substrate 11 transmits to the back surface of the backlight substrate 11.

As shown in FIG. 4, the reflective material layer 13 is formed by coating a reflective material on a surface of the backlight substrate 11 after the metal traces 12 etched. Therefore, the metal traces 12 are disposed between the backlight substrate 11 and the reflective material layer 13. Thereafter, a plurality of pad openings 1311, 1312 are formed within the reflective material layer 13.

As shown in FIG. 3 and FIG. 4, a position of each of the pad openings 1311, 1312 corresponds to a position of the metal traces 12. That is, each of the pad openings 1311, 1312 penetrates from a surface of the reflective material layer 13 to a surface of the metal traces 12, and an orthographic projection of each of the pad openings 1311, 1312 projected on the backlight substrate 11 is completely within an area of the metal traces 12. In this embodiment, each of the pad openings 1311, 1312 has a width that is smaller than a width of the corresponding positive electrode line 121 or smaller than a width of the negative electrode line 123.

As shown in FIG. 3 and FIG. 4, each of the pad openings 1311, 1312 has a solder paste application region 132, and a solder paste is applied to the solder paste application region 132 for the following die-bonding process. In this embodiment, the pad openings 1311, 1312 can be formed into a plurality of pairs, the number of the pairs is set according to the number of LED chips 14, each pair of the pad openings includes a positive electrode pad opening 1311 and a negative electrode pad opening 1312, the positive electrode pad opening 1311 corresponds to the positive electrode line 121; the negative electrode pad opening 1312 corresponds to the negative electrode line 123.

It can be seen that, after the surface of the backlight substrate 11 is coated or attached with the reflective material, except for the pad openings 1311, 1312, the other regions of the backlight substrate 11 can be covered by the reflective material, which can effectively improve the light reflection at the pads 15, and the metal traces 12 are maximally covering the backlight substrate 11, which can effectively reduce the light transmission and improve the light efficiency.

The LED backlight device 1 further includes a plurality of LED chips 14 and a plurality of pads 15.

As shown in FIG. 4, only shows a cross-sectional view of a single LED chip 14 with corresponding circuit. In this embodiment, a pad 15 is fixed to each of p-junctions and n-junctions of each LED chip 14. During the die-bonding process, the pad 15 of the p-junction of the LED chip 14 bonds corresponding to the positive electrode pad opening 1311, and the pad 15 of the n-junction of the LED chip 14 bonds corresponding to the negative electrode pad opening 1312.

Within the normal process deviation range, the pad openings 1311, 1312 can always be formed on the circuit electrodes, for example, on the positive electrode line 121 or the negative electrode line 123, and each of the pad openings 1311, 1312 can essentially ensure that the sizes are the same, which is benefit to the flatness and yield of die bonding. The LED chips 14 are selected the manufactured material of the LED according to the process requirements, so that emits corresponding colors. Currently, three colors of red, green and blue are widely used. Whether using LEDs for monochrome, dual-color or three-color screens, if the screen would display an image, each of LEDs which constitutes a pixel requires to be able to adjust the brightness. If the fineness of the adjustment is higher, the level of gray scale is higher, the displayed image is more exquisite, and the color is richer.

A light emitting diode (LED) display device structure according to the present invention describes below by demonstrating a LED liquid crystal display device.

Figure 5:
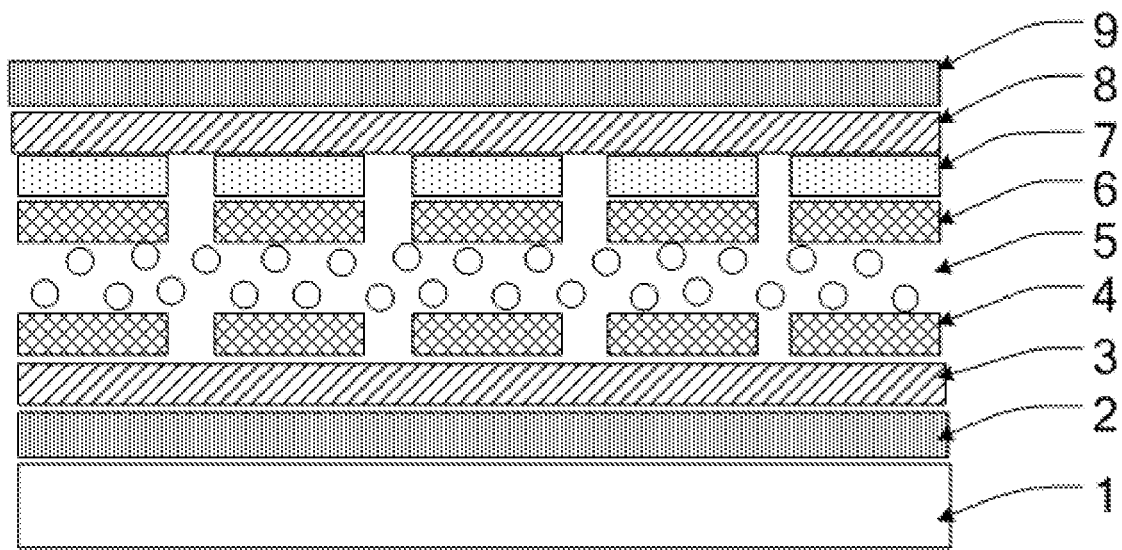
FIG. 5 is a schematic view of layers structure of a LED display device according to an embodiment of the present invention, wherein,
1 LED backlight device;
10 backlight partitions;
11 backlight substrate;
12 metal traces;
13 reflective material layer;
14 LED chip;
15 pads;
121 positive electrode lines;
122 positive electrode connecting line;
123 negative electrode lines;
124 negative electrode connecting line;
1311 positive electrode connecting line;
1312 negative electrode pad openings;
132 solder paste coating area;
2 first polarizer;
3 first glass substrate;
4 first electrode layer;
5 liquid crystal molecules;
6 second electrode layer;
7 color filter;
8 second glass substrate;
9 second polarizer.

As shown in FIG. 5, a LED display device according to an embodiment of the present invention includes the LED backlight device 1, a first polarizer 2, a first glass substrate 3, a first electrode layer 4, a liquid crystal molecular layer 5, a second electrode layers 6, a color filter 7, a second glass substrate 8, and a second polarizer 9. The first polarizer 2 and the second polarizer 9 are disposed opposite to each other, and are disposed on the LED backlight device 1. The first glass substrate 3 and the second glass substrate 8 are disposed opposite to each other, and are disposed between the first polarizer 2 and the second polarizer 9. The first electrode layer 4 and the second electrode layer 6 are disposed between the first glass substrate 3 and the second glass substrate 8. The liquid crystal molecular layer 5 is disposed between the first electrode layer 4 and the second electrode layer 6. The color filter 7 is disposed between the second glass substrate 8 and the second electrode layer 6. The light emitted from the LED backlight device 1 sequentially passes through the first polarizer 2, the first glass substrate 3, the liquid crystal molecules 5, the color filter 7, the second glass substrate 8, and the second polarizer 9, and then transmit out. Because the focus of the present invention is the LED backlight device 1 of the LED display device, other components of the LED display device will not describe here in detail.

Certainly, the LED backlight device 1 of the present embodiment can also be applied to other kinds of LED display devices. The LED liquid crystal display device described in this embodiment is merely an exemplary explanation of the present invention, and is not a limitation for the present invention.

The above embodiments are only the preferred embodiments of the present invention, and are not intended to limit the scope of the present invention. Any modifications, equivalents, and improvements made within the spirit and scope of the present invention should be included in the scope of the present invention.

The invention claimed is:

1. A light emitting diode (LED) backlight device, comprising:
   a backlight substrate having a plurality of backlight partitions;
   a reflective material layer covering a surface of the backlight substrate;
   a plurality of metal traces disposed within the backlight partitions and disposed between the backlight substrate and the reflective material layer;
   a plurality of pad openings penetrating from a surface of the reflective material layer to a surface of the metal traces, wherein an orthographic projection of each of the pad openings projected on the backlight substrate is completely within an area of the metal traces; and a plurality of solder paste application regions separately located in the corresponding pad openings.

2. The LED backlight device according to claim 1, wherein the metal traces comprises:
   at least one pair of a positive electrode line and a negative electrode line, wherein the positive electrode line and the negative electrode line of a same pair are adjacent and parallel to each other;
   a positive electrode connecting line connected to the positive electrode line; and
   a negative electrode connecting line connected to the negative electrode line.

3. The LED backlight device according to claim 2, wherein the pad openings have a plurality of pairs, and each of the pairs of the pad openings comprises:
   a plurality of positive electrode pad openings corresponding to the positive electrode line;
   a plurality of negative electrode pad openings corresponding to the negative electrode line.

4. The LED backlight device according to claim 3, wherein the LED backlight device further comprises:
   a plurality of LED chips, each of which has a p-junction and a n-junction; and
   a plurality of pads separately fixed to the p-junction and the n-junction of the LED chip;
   wherein the pads fixed on the p-junction of the LED chip correspond to the positive electrode pad openings, and the pads fixed on the n-junction of the LED chip correspond to the negative electrode pad openings.

5. The LED backlight device according to claim 4, wherein each of the pad openings has a width that is smaller than a width of the corresponding positive electrode line or smaller than a width of the negative electrode line.

6. The LED backlight device according to claim 2, wherein a width of a gap between the positive electrode line and the negative electrode line adjacent to each other ranges from 40 μm to 60 μm.

7. The LED backlight device according to claim 1, wherein the backlight substrate is a flexible circuit board or a printed circuit board.

8. The LED backlight device according to claim 1, wherein a distribution structure of the backlight partitions is a matrix structure.

9. The LED backlight device according to claim 8, wherein a distance between two of the backlight partitions adjacent to each other ranges from 40 μm to 70 μm.

10. A light emitting diode (LED) display device comprising the LED backlight device according to claim 1.

* * * * *

UNITED STATES PATENT AND TRADEMARK OFFICE
CERTIFICATE OF CORRECTION

PATENT NO. : 11,092,849 B2  
APPLICATION NO. : 16/309743  
DATED : August 17, 2021  
INVENTOR(S) : Ma et al.

Page 1 of 1

It is certified that error appears in the above-identified patent and that said Letters Patent is hereby corrected as shown below:

On the Title Page

Item (73) Assignee:  
WUHAN CHINA STAR OPTOELECTRONICS TECHNLOGY CO., LTD., Hubei (CN)  
Is changed to:  
WUHAN CHINA STAR OPTOELECTRONICS TECHNOLOGY CO., LTD., Hubei (CN)

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*